United States Patent [19]

Zhed et al.

[11] Patent Number: 4,729,905
[45] Date of Patent: Mar. 8, 1988

[54] METHOD FOR PRODUCTION OF CUTTING TOOLS

[75] Inventors: Viktor P. Zhed, Moscow; Alexei G. Gavrilov, Domodedovo; Elena I. Kurbatova, Moscow; Andrei K. Sinelschikov, Moscow; Albert M. Boyarunas, Kharkov; Vitaly M. Smirnov, Moscow, all of U.S.S.R.

[73] Assignee: Vsesojuzny Nauchno-Issledovatelsky Institut Instrumenta, Moscow, U.S.S.R.

[21] Appl. No.: 2,310

[22] Filed: Jan. 9, 1987

[51] Int. Cl.$^4$ ............................................... B05D 3/06
[52] U.S. Cl. .................................... 427/37; 427/38; 427/295; 427/319; 427/377; 427/380; 427/383.7
[58] Field of Search ............... 427/37, 38, 295, 319, 427/377, 380, 383.7

[56] References Cited

U.S. PATENT DOCUMENTS 3,967,035  6/1976  Hale .................................. 428/336

Primary Examiner—Bernard D. Pianalto
Attorney, Agent, or Firm—Burgess, Ryan & Wayne

[57] ABSTRACT

A method for the production of cutting tools from an iron-based alloy and having a wear-resistant coating based on interstitial phases is provided and comprises depositing the wear-resistant coating by condensing a cathode material evaporable by an arc discharge, use being made of titanium or a titanium-based alloy as the cathode material. Upon depositing a coating of a predetermined thickness, an oxygen-containing redox gas or gaseous mixture is fed into the vacuum chamber and the cutting tool is heated up to the temperature of the eutectoid decomposition in the pseudobinary 'iron-titanium' system. Thereupon the cutting tool is subjected to annealing in an atmosphere of the oxygen-containing redox gas or gaseous mixture for 10 to 40 minutes at the temperature of the martensitic transformation in the pseudobinary 'iron-titanium' system.

1 Claim, No Drawings

METHOD FOR PRODUCTION OF CUTTING TOOLS

The present invention relates generally to metal machining, more specifically to cutting tools, provided with a wear-resistant coating, and has particular reference to a method for production of such cutting tools.

The present method for production of cutting tools is applicable to a variety of cutting tools made of iron-based alloys, in particular, of steels such as drills, single-point tools, and milling cutters designed to operate at rugged duties.

BACKGROUND OF THE INVENTION

The present-day toolmaking practice has as one of its leading trends the attainment of higher durability of cutting tools by depositing wear-resistant coatings thereon, said coatings being made of interstitial phases based on metals of Groups III through VI of the Periodic System. Some of these metals, e.g., Zr, Hf, La, Al, Fe, Co, Mn, when cooled from the temperatures of the order of 1000° C. down to room temperature, are liable to undergo polymorphic transformations, or to form interstitial phases of the various modifications which are also capable of polymorphic transformations when exposed to cooling. It is common knowledge that all polymorphic transformations of metals and interstitial phases are accompanied by a change in their lattice structure, which results in stresses arising therein, in alteration of their physical properties, e.g., specific volume, magnetic hysteresis, and in impaired mechanical properties, in particular, plasticity.

When the aforesaid metals or interstitial phases undergo crystallization from a liquid or vaporous state, some residual unstable modifications are present in their structure that have not undergone polymorphic transformations. Non-homogeneous phase composition leads, in turn, to unstable mechanical characteristics of such metal and interstitial phases.

Known in the art is a method for production of a cemented-carbide item provided with a wear-resistant coating based on an interstitial phase (aluminium oxide) liable to undergo polymorphic transformations when cooled (cf. U.S. Pat. No. 3,967,035, Int. Cl. C23C 11/08, published June 29, 1976). Said wear-resistant coating is deposited upon the cemented-carbide article by the gaseous-phase method which is characterized by high heating temperatures (900° to 1250° C.). The article being processed is kept at the above temperatures for one to three hours in an atmosphere of aluminium gallide, steam and hydrogen. To establish a wear-resistant coating from the alpha-modification alumina, the steam-to-hydrogen ratio should be within 0.025 to 2.0. The aforesaid alpha-modification exhibits maximum stability to heating up to 2000° C., and is free from admixtures of alkali metals which are present in other less stable modifications of alumina.

The method discussed above is instrumental in depositing a wear-resistant coating made from interstitial phases of transition metals, upon a cemented-carbide article. However, the method is inapplicable for depositing such a coating upon a cutting tool made of steel which features a lower unhardening point as compared with cemented carbides.

Another prior-art method for making cutting tools from an iron-based alloy provided with a wearresistnt coating based on interstitial phases is known (cf. the journal 'Physics and chemistry of materials treatment', Nauka Publishers, No. 2, 1979, pp. 169 to 170). In this method a bias voltage is applied to the cutting tool placed in a vaccum chamber, the tool is heated and cleaned up by being bombarded with the ions of the cathode material evaporable by an arc discharge, whereupon the bias voltage is reduced to a value at which a wearresistant coating is formed, and the predetermined-thickness wear-resistant coating is established due to interaction of the cathode material being evaporated with a reactant gas admitted to the vacuum chamber, after which the cutting tool is annealed.

According to the method discussed above, a molybdenum-based alloy is, used as the cathode material which is not liable to develop polymorphic transformation upon being cooled, and the wear-resistant coating is formed from molybdenum carbide. However, molybdenum carbide features but low oxidation resistance, heat resistance and thermal conductivity, inadequate thermodynamic stability, as well as is liable to decompose at temperatures below its melting point. As a result, the molybdenum-carbide coating exhibits insufficient wear-resistance.

To relieve the molybdenum carbide-based wearresistant coating of residual stresses the cutting tool is subjected to a stepped vacuum annealing. It should be noted that the vacuum annealing results in partial loss of hardness of both the wear-resistant coating and the cutting tool itself, which affects adversely its service durability.

SUMMARY OF THE INVENTION

The object of the invention is to provide a method for making a cutting tool that would ensure higher endurance of the wear-resistance coating of said cutting tool and thereby longer service life of the cutting tool itself.

Said object is accomplished due to the fact that in a method for production of cutting tools from an iron-based alloy provided with a wear-resistant coating based on interstitial phases, the cutting tool is placed in a vacuum chamber, a bias voltage is applied thereto, the tool is heated up and cleaned up by being bombarded with ions of the cathode material evaporable by virtue of an arc discharge, whereupon the bias voltage is reduced to a value at which a wear-resistant coating is formed, and such a coating having a preset thickness is established due to interaction of the cathode material being evaporated with a reactant gas admitted to the vacuum chamber, after which the cutting tool is annealed. According to the invention, titanium or a titanium-based alloy is used as the material of the cathode and the formation of a preset-thickness wear-resistant coating is followed by an increase in the bias voltage to the value equal to that effective at the tool preheating and cleaning, whereupon an oxygen-containing redox gas or gaseous mixture is fed to the vacuum chamber to heat up the cutting tool to the temperature of eutectoid decomposition in a psuedobinary 'iron-titanium' system, while annealing of the cutting tool is carried out in the oxygen-containing redox gas or gaseous mixture for 10 to 40 minutes at a temperature of the martensitic transformation in the pseudobinary 'iron-titanium' system.

The method for production of cutting tools, according to the invention, makes it possible to attain better performance characteristics of the cutting tool and increase its service durability by at least 1.5 times.

The cutting tool service life is increased due to higher endurance of the wear-resistant coating itself based on the interstitial phases of titanium, in particular, titanium nitrides which are the most refractory titanium compounds incapable of polymorphic transformations, as well as due to the fact that titanium which when cooled exhibits polymorphic transformations in the surface layer of the cutting tool and in the wear-resistant coating itself deposited on said superficial layer, and is in the form of a stable alpha-modification. As a result, there are reduced internal stresses both in the wear-resistant coating itself and in the surface layer of the cutting tool on which said coating is deposited. This in turn provides for stronger bonding of the wearresistant coating to the surface layer of the cutting tool and prevents the wear-resistant coating from separation during cutting tool operation.

Presence of titanium in the cutting tool surface layer and in the wear-resistant coating itself is accounted for by the conditions of the ionic bombardment, whereby the wear-resistant coating is deposited, in particular, by the ability of the titanium ions to implant in the surface layer of the cutting tool during its heating up and refining before formation of the wear-resistant coating. Titanium is present as the drop phase also in the microvolumes of the wear-resistant coating based on its refractory compounds.

Stable equilibrium alpha-modification of titanium is obtained due to appropriately selected conditions of the cutting tool heating in the vacuum chamber after deposition of the wear-resistant coating, as well as the conditions of its subsequent annealing.

Heating of the cutting tool in the vacuum chamber up to the temperature of eutectoid decomposition in the pseudobinary 'iron-titanium' system causes decomposition of the unstable beta-modification of titanium into its stable alpha-modification and a number of intermediate unstable modifications thereof ($\alpha'$, $\alpha''$), which are also liable to turn into the stable alpha-modification of titanium at the stage of annealing when heated up to the temperature of the martensitic transformation in the psuedobinary 'iron-titanium' system.

The presence of an oxygen-containing redox gas or a gaseous mixture, in particular, such constituents thereof as oxygen, is also conducive to the formation of a stable alpha-modification of titanium.

DETAILED DESCRIPTION OF THE INVENTION

In what follows the invention will be illustrated in a detailed description of a specific exemplary embodiment thereof.

The method for production of cutting tools resides in the following. First a cutting tool is made from an iron-based alloy, in particular, from a tool material in the capacity of which use can be made of, e.g., high speed steels.

Then the cutting tool is placed in a vacuum chamber, wherein a cathode is provided, made of a polymorphic metal or of an alloy thereof making part of the wear-resistant coating. The cathode is made, in the given particular case, of titanium or Ti-based alloys.

Then the chamber is evacuated and an arc discharge is stricken therein for the cathode material to evaporate. Next a bias voltage of 800 to 1000 V is applied to the cutting tool and its surface is heated and cleaned up by being bombarded with ions of the cathode material being evaporated. As a result, the cutting tool is heated up to a temperature at which no loss of hardness may occur, said temperature being checked against a pyrometer.

Thereupon the bias voltage applied to the cutting tool, is reduced to a value at which the cathode material being evaporated is free to condense on the cutting tool surface. The value of that voltage is known to lie between 25 and 750 V. Concurrently fed to the vacuum chamber is a reactant gas which interacts with the cathode material being evaporated to establish the wear-resistant coating. Used as a reactant gas are such gases as nitrogen, methane, and borane. The reactant gas is known to be fed into the vacuum chamber at a pressure of $5 \cdot 10^{-2}$ to $5 \cdot 10^{-5}$ mm Hg.

Once the wear-resistant coating of a predetermined thickness depending on the duration of the reactant gas feed, has been established an oxygen-containing redox gas or a gaseous mixture is fed into the vacuum chamber, the pressure in the latter being maintained within the limits specified for the aforementioned reactant gas.

Used as an oxygen-containing redox gas or gaseous mixture is most commonly atmospheric air, though some other gases, such as carbon dioxide or nitrogen monoxide may be applied.

While feeding the oxygen-containing redox gas or gaseous mixture into the vacuum chamber, the bias voltage applied to the cutting tool is increased up to a value effective at the cleaning and heating up i.e., 800 to 1000 V so as to heat the cutting tool up to the temperature of the eutectoid decomposition in a pseudobinary 'iron-titanium' system. Alloys of the pseudobinary 'iron-titanium' system are formed in the surface layers of the cutting tool in the course of its cleaning and heating up by virtue of bombardment with the titanium ions. In the pseudobinary system mentioned above 'iron' implies a steel of a definite composition from which the cutting tool is made, while 'titanium' implies metallic titanium or its alloy from which the cathode is made.

It is at the aforementioned temperature that the unstable titanium beta-modification is decomposed into a number of the intermediate phases, e.g., $\alpha'$, $\alpha''$, and into the stable alpha-modification of titanium. A specific value of the temperature of the eutectoid decomposition under conditions of ionic bombardment is to be found experimentally, being dependent upon the composition of a pseudobinary 'iron-titanium' system, and is known to lie within 350° and 500° C. Heating up of the cutting tool is carried out in the presence of an oxygen-containing redox gas or gaseous mixture whose constituents, especially oxygen, contribute to formation of the titanium alpha-modification. When the cutting tool is heated up to temperatures falling out of the limits mentioned above, no decomposition of the beta-modification occurs.

Once the aforesaid temperature which is monitored with the aid of a pyrometer, has been reached the feeding of the reactant gas and the oxygen-containing redox gas or gaseous mixture ceases, the bias voltage is removed from the cutting tool, and the arc discharge is quenched.

Next the cutting tool is annealed in any heretofore-known heating appliance, e.g., in a heating furnace, in an atmosphere of the oxygen-containing redox gas or gaseous mixture at a temperature of the martensitic transformation in a pseudobinary 'iron-titanium' system. The aforementioned gas or gaseous mixture may be the same as in the heating up following the coating deposition.

It is at the temperature of the martensitic transformation that the unstable intermediate phases of the α', α" type turn into the equilibrium alpha-modification of titanium. The value of the martensitic transformation temperature is determined also experimentally, depends on the constituents of the pseudobinary system and lies within 150° and 380° C.

The tool holding time under the annealing temperature depends on the value of this temperature, that is, the higher the temperature the shorter the annealing time. However, the tool holding time shorter than 10 minutes is insufficient for the martensitic transformation to occur completely in alloys of the pseudobinary 'iron-titanium' system, while the holding time in excess of 40 minutes is not required as the aforesaid transformation has occurred completely within that lapse of time.

Once having been annealed the tool is cooled down to room temperature.

To promote understanding of the present invention given below are some specific embodiments thereof.

EXAMPLE 1

A ten-piece lot of dia. 5 mm twist drills was made of a high-speed steel of the following weight percentage composition: C - 0.85 Cr - 3.6; W - 6.0; V - 2.0; Mo - 5.0; and Fe being the balance. The lot of the drills cleaned from mechanical impurities and deoiled was placed in the vacuum chamber of a known plant for deposition of wear-resistant coatings by the method of condensation of a metal by virtue of ionic bombardment. The chamber was evacuated down to a pressure of $5.10^{-5}$ mm Hg, a 1100-V bias voltage was applied to the drills, an arc discharge was stricken in the chamber to evaporate a titanium cathode, and the surface of the drills was cleaned and heated up to 520° C. As a result, the alloys of a pseudobinary 'iron-titanium' system were formed in the surface layers of the drills, the term 'iron' in the aforesaid system referring to the high-speed steel of the aforestated composition.

Then the bias voltage was reduced to 200 V and a reactant gas, namely, nitrogen was fed to the chamber, the pressure therein being $3 \cdot 10^{-3}$ mm Hg. Nitrogen was fed for one hour, and a 6-μm thick titanium-nitride wear-resistant coating was formed on the surfaces of the drills.

Thereupon the bias voltage applied to the drills was increased again to 1100 V, i.e., the value effective in the course of heating up and cleaning of the drills and air was fed into the chamber as an oxygen-containing redox gaseous mixture, the pressure in the chamber being maintained at a preceding level. The drills provided with the wear-resistant coating were heated up to 500° C., that is, to the temperature of the eutectoid decomposition in the aforesaid pseudobinary 'iron-titanium' system. Once said temperature has been reached the reactant gas and air were no longer be fed, the arc discharge was quenched, the bias voltage was removed, and the drills were cooled in the chamber down to room temperature. Next the drills were annealed, for which purpose they were placed in a furnace and heated in the atmospheric air used as an oxygen-containing redox gaseous mixture, up to 300° C., i.e., the temperature of the martensitic transformation in said psuedobinary 'iron-titanium' system, whereupon the tools were held at that temperature for 30 minutes. Then the drills were cooled down to room temperature. The lot of 5-mm dia. drills were subjected to endurance tests by drilling holes in a steel of the following weight percentage composition: C - 0.42 to 0.49; Fe being the balance, on an upright drill press with the assistance of any known cutting coolant under the following cutting conditions: speed V - 45 m/min; feed rate S - 0.18 mm/rev, drilling depth 1-3d = 15 mm.

Drill dullness symptom - creaky operation.

The average number of holes drilled by one drill - 330.

EXAMPLE 2

The lot of twist drills was made similar to that described in Example 1, and the wear-resistant coating was deposited on the drills in a way similar to that described in Example 1 with the sole exception that used as the cathode material was the titanium-based alloy of the following weight percentage composition: Al - 1.4; Mn - 1.3, Ti being the balance. The 6-μm thick wear-resistant coating was deposited on the surface of the drills from a titanium nitride-based interstitial phase.

Further on the method was carried into effect in the same way as described in Example 1 except for the fact tha the drills were heated up to 480° C., i.e. to the temperature of the eutectoid decomposition in the pseudobinary 'iron-titanium' system, wherein the term 'iron' implied the high-speed steel of the aforespecified composition, while the term 'titanium' referred to the titanium-based alloy of the aforessaid composition used as the cathode material. When annealed the drills were heated up to 200° C., i.e., to the temperature of the martensitic transformation in the aforesaid pseudobinary system, and were held at the temperature for 40 minutes.

The endurance tests were applied to the drills in the same way as in Example 1. The average number of holes drilled by one drill - 315.

EXAMPLE 3

The lot of twist drills were made similar to that described in Example 1, and the wear-resistant coating was deposited on the drills in a way similar to that described in Example 1 with the exception that used as the cathode material was the titaniumbased alloy of the following weight percentage composition: Al - 2.5; Mn - 1.2; Ti being the balance. Then the 6-μm thick wear-resistant coating was deposited on the surface of the drills from a TiN-based interstitial phase. Further on the method was carried into effect in the same way as described in Example 1 with the sole exception that the drills were heated up to 490° C., i.e., to the temperature of the eutectoid decomposition in the psuedobinary 'iron-titanium' system, wherein the term 'iron' implied the high-speed steel of the aforestated composition, while the term 'titanium' referred to the titanium-based alloy of the aforesaid composition used as the cathode material. When annealed the drills were heated up to 280° C., i.e., to the temperature of the Martensitic transformation in the aforesaid pseudobinary system, and were held at that temperature for 20 minutes.

The endurance tests were applied to the drills in the same way as in Example 1. The average number of holes drilled by one drill - 310.

EXAMPLE 4

The lot of twist drills was made similar to that described in Example 1, and the wear-resistant coating was deposited on the drills in a way similar to that described in Example 1 with the exception that used as the cathode material was the titanium-based alloy of the following weight percentage composition: Al - 6.0; Sn

- 3.0; Ti being the balance. Then the 6-μm thick wear-resistant coating was established on the surface of the drills from a TiN-based interstitial phase. Further on the method was carried into effect in the same way as described in Example 1 with the sole exception that the drills were heated up to 350° C., i.e., to the temperature of the eutectoid decomposition in the pseudobinary 'iron-titanium' system, wherein the term 'iron' implied the high-speed steel of the aforesaid composition, while the term 'titanium' referred to the titanium-based alloy of the aforesaid composition used as the cathode material. When annealed the drills were heated up to 320° C., i.e., to the temperature of the martensitic transformation in the aforesaid pseudobinary 'iron-titanium' system, and were held for 20 min.

The endurance tests were applied to the drills in the same way as in Example 1. The average number of holes drilled by one drill - 350.

EXAMPLE 5

The lot of twist drills was made similar to that described in Example 1, and the wear-resistant coating was deposited on the drills in a way similar to that described in Example 1 with the exception that used as the cathode material was the titanium-based alloy of the following weight percentage composition: Al - 6.0; Ti being the balance. Then the 6-μm thick wear resistant coating was established from a TiN-based interstitial phase. Next the bias voltage was increased to 1100 V and simultaneously carbon dioxide was fed into the vacuum chamber as the oxygen-containing redox gas. The drills were heated up to 400° C., i.e., to the temperature of the eutectoid decomposition in the pseudobinary 'iron-titanium' system, wherein the term 'iron' referred to the high-speed steel of the aforespecified composition, while the term 'titanium' implied the titanium-based alloy of the aforesaid composition. When annealed the drills were heated in an atmosphere of carbon dioxide up to 290° C., i.e., to the temperature of the martensitic transformation in the aforesaid pseudobinary 'iron-titanium' system, and were held in the furnace for 35 minutes.

The endurance tests were applied to the drills in the same way as in Example 1. The average number of holes drilled by one drill - 300.

EXAMPLE 6

The lot of twist drills was made similar to that described in Example 1, and the wear-resistant coating was deposited on the drills in a way similar to that described in Example 1 with the exception that used as the cathode material was the titanium-based alloy of the following weight percentage composition: Al - 30; Ti being the balance. Then the 6-μm thick wear-resistant coating was established from a TiN-based interstitial phase. Next the bias voltage applied to the drills was increased to 1100 V and simultaneously nitrogen monoxide was fed into the vacuum chamber as the oxygen-containing redox gas. The drills were heated up to 480° C., i.e., to the temperature of the eutectoid decomposition in the pseudobinary 'iron-titanium' system, wherein the term 'iron' implied the high-speed steel of the aforespecified composition, while the term 'titanium' referred to the titanium-based alloy of the aforesaid composition. When annealed the drills were heated in the nitrogen-monoxide atmosphere up to 380° C., i.e., to the temperature of the martensitic transformation in the aforesaid pseudobinary 'iron-titanium' system, and were held in the furnace for 10 minutes.

The endurance tests were applied to the drills in the same way as in Example 1. The average number of holes drilled by one drill - 300.

EXAMPLE 7

The lot of twist drills was made similar to that described in Example 1, and the wear-resistant coating was deposited on the drills in a way similar to that described in Example 1 with the exception that used as the cathode material was the titanium-based alloy of the following weight percentage composition: Al - 6.0; V - 4.0; Ti being the balance. Then the 6-μm thick wear-resistant coating was established from a TiN based interstitial phase. Further on the method was carried into effect in the same way as described in Example 1 with the sole exception that the drills were heated up to 450° C., i.e. to the temperature of the eutectoid decomposition in the pseudobinary 'iron-titanium' system, wherein the term 'iron' implied the high-speed steel of the aforementioned composition, and the term 'titanium' referred to the titanium-based alloy of the aforesaid composition. When annealed the drills were heated in the carbon-dioxide atmosphere up to 310° C., i.e., to the temperature of the martensitic transformation in the aforesaid pseudobinary 'iron-titanium' system, and were held in the furnace for 25 minutes.

The endurance tests were applied to the drills in the same way as in Example 1. The average number of holes drilled with one drill - 335.

EXAMPLE 8

The lot of twist drills was made similar to that described in Example 1, and the wear-resistant coating was deposited on the drills in a way similar to that described in Example 1 with the exception that used as the cathode material was the titanium-based alloy of the following weight percentage composition: Al - 8.0; Nb - 2.0; Ta - 1.0; Ti being the balance, and as the reactant gas, methane. Then the 6-μm thick wear-resistant coating was established from a TiC-based interstitial phase. Further on the method was carried into effect in the same ways as described in Example 1 with the sole exception that the drills were heated up to 500° C., i.e., to the temperature of the eutectoid decomposition in the pseudobinary 'iron-titanium' system, wherein the term 'iron' implied the high-speed steel of the aforementioned composition, while the term 'titanium' referred to the titanium-based alloy of the aforesaid composition. When annealed the drills were heated up to 320° C., i.e., to the temperature of the martensitic transformation in the aforesaid pseudobinary 'iron-titanium' system, and were held in the furnace for 30 minutes.

The endurance tests were applied to the drills in the same way as in Example 1. The average number of holes drilled with one drill - 309.

EXAMPLE 9

The lot of twist drills was made similar to that described in Example 1, and the wear-resistant coating was deposited on the drills in a way similar to that described in Example 1 with the exception that used as the cathode material was the titanium-based alloy of the following weight percentage composition: P - 0.3; Ti being the balance, and as the reactant gas, borane. then the 6-μm thick wear-resistant coating was established from a titanium diboride-based interstitial phase. Further on the method was carried into effect in the same way as described in Example 1 with the sole exception that the drills were heated up to 490° C., i.e., to the temperature of the eutectoid decomposition in the pseudobinary 'iron-titanium' system, wherein the term 'iron' implied the high-speed steel of the aforementioned composition, while the term 'titanium' referred to the titanium-based alloy of the aforesaid composition. When annealed the drills were heated up to 300° C., i.e., the temperature of the martensitic transformation in the aforesaid pseuobinary system, and were held for 35 minutes.

The endurance tests were applied to the drills in the same way as in Example 1. The average number of holes drilled with one drill - 319.

EXAMPLE 10

A ten-piece lot of dia. 5 mm twist drills was made of a high-speed steel of the following weight percentage composition: C - 1.0; Cr - 6.0; W - 1.3; V - 0.5; Fe being the balance. Then the lot of the drills cleaned from mechanical impurities and deoiled was placed in the vacuum chamber of a known plant for deposition of a wear-resistant coating by virtue of cond1ensation of a metal through ionic bombardment. The chamber was evacuated down to a pressure of $5.10^{-5}$ mm Hg, a 900-V bias voltage was applied to the drills, an arc discharge was stricken in the chamber to evaporate the cathode made of a titanium-based alloy of the following weight percentage composition: Al - 6.5; Cr - 0.9; Si - 0.4; Fe - 0.6; B - 0.1; Ti being the balance. Next the surface of the drills was cleaned and heated up to 200° C. As a result, the alloys of a pseudobinary 'iron-titanium' system were formed in the surface layers of the drills, the term 'iron' in the aforesaid system referring to the high-speed system of the aforementioned composition, while the term 'titanium' implied the titanium-based alloy of the aforesaid composition used as the cathode material. Then the bias voltage was reduced to 80 V and nitrogen was fed into the vacuum chamber as the reactant gas, the pressure within th chamber being $2.10^{-3}$ mm Hg. As a result of one-hour interaction of nitrogen with the evaporable cathode material, a 6-$\mu$m thick titanium nitride-based wear-resistant coating was established on the surface of the drills. Thereupon the atmospheric air was fed into the vacuum chamber as the oxygen-containing redox gaseous mixture, the pressure in the chamber being maintained at a preceding level. At the same time the bias voltage applied to the drills was increased up to 900 V. Thus, the drills were heated up to 350° C., i.e., to the temperature of the eutectoid decomposition in the aforesaid pseudobinary 'iron-titanium' system. Once that temperature had been reached the feed of the reactant gas and atmospheric air was stopped, the arc discharge was quenched, the bias voltage was removed from the drills and the latter were cooled down to room temperature. Next the drills were annealed, for which purpose the tools were placed in a furnace and heated in the atmospheric air up to 150° C., i.e., the temperature of the martensitic transformation in the aforesaid pseudobinary 'iron-titanium' system, and were held in the furnace for 30 minutes. Then the drills were cooled down to room temperature.

The endurance tests were applied to the lot of the drills in the same way as described in Example 1 with the exception that the cutting speed V was equal to 32 m/min and the drilling depth l = =d=5 mm.

The average number of holes drilled with the same drill -70.

What is claimed is:

1. A method for production of cutting tools from an iron-based alloy, provided with a wear-resistant coating based on interstitial phases, comprising the steps:
   (a) placing the cutting tool in a vacuum chamber provided with a cathode;
   (b) applying a bias voltage to said cutting tool;
   (c) striking an arc discharge in said vacuum chamber to evaporate the material of said cathode, wherein said cathode is comprised of at least one material selected from the group consisting of titanium and a titanium alloy;
   (d) preheating and cleaning said cutting tool by bombarding it with the ions of said evaporable material of said cathode;
   (e) reducing said bias voltage to that at which said wear-resistant coating is formed;
   (f) feeding a reactant gas into said vacuum chamber;
   (g) establishing said wear-resistant coating on the surface of said cutting tool by interaction of said ions of said evaporable cathode material with said reactant gas fed into said vacuum chamber;
   (h) increasing said bias voltage to the value of said bias voltage effect for preheating and cleaning said cutting tool;
   (i) feeding an oxygen-containing redox gas into said vacuum chamber;
   (j) heating said cutting tool to the temperature of the eutectoid decomposition in the pseudobinary 'iron-titanium' system;
   (k) annealing said cutting tool at the temperature of the martensitic transformation in said pseudobinary 'iron-titanium' system in an atmosphere of an oxygen-containing redox gas for 10 to 40 minutes.

* * * * *